US008255850B2

(12) United States Patent
Jain et al.

(10) Patent No.: US 8,255,850 B2
(45) Date of Patent: Aug. 28, 2012

(54) FABRICATING IC WITH NBTI PATH DELAY WITHIN TIMING CONSTRAINTS

(75) Inventors: Palkesh Jain, Bangalore (IN); Arvind Nembili Veeravalli, Bangalore (IN); Ajoy Mandal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 407 days.

(21) Appl. No.: 12/354,796

(22) Filed: Jan. 16, 2009

(65) Prior Publication Data

US 2009/0187868 A1 Jul. 23, 2009

(30) Foreign Application Priority Data

Jan. 21, 2008 (IN) .............................. 175/CHE/2008

(51) Int. Cl.
*G06F 17/50* (2006.01)
*G06F 9/455* (2006.01)
(52) U.S. Cl. ........ 716/113; 716/106; 716/108; 716/115; 716/132; 716/134; 703/13; 703/14
(58) Field of Classification Search .................. 716/106, 716/108, 113, 115, 132, 134; 703/13–22
See application file for complete search history.

(56) References Cited

U.S. PATENT DOCUMENTS

| | | | | |
|---|---|---|---|---|
| 6,708,312 | B1 * | 3/2004 | Chiang et al. ................. | 716/134 |
| 7,542,891 | B2 * | 6/2009 | Lin et al. ......................... | 703/14 |
| 7,689,377 | B2 * | 3/2010 | Jain et al. ...................... | 702/117 |
| 7,802,218 | B2 * | 9/2010 | Inoue et al. ................... | 716/111 |

OTHER PUBLICATIONS

Vattikonda et al., Modeling and Minimization of PMOS NBTI Effect for Robust Nanometer Design, AMC, 2004, pp. 1-6.*
"On the Need for Statistical Timing Analysis", Farid Najm, ECE Dept., University of Toronto, published in DAC 2005, Anaheim, CA, Jun. 13-17, 2005, pp. 764-765.
"Statistical Timing Analysis Based on a Timing Yield Model", Farid N.Najm, et al., ECE Dept., University of Toronto, published in DAC 2004, Jun. 7-11, 2004, San Diego, CA, pp. 460-465.
Farid N. Najm, "On the Need for Statistical Timing Analysis",, ACM, Year Jun. 13-17, 2005, pp. 764-765, Anaheim, California, USA.
Farid N. Najm and Noel Menezes, "Statistical Timing Analysis Based on a Timing Yield Model", Year Jun. 7-11, 2004, pp. 460-465, San Diego, California, USA.
R. D. Schrimpf, K. M. Warren, R. A. Weller, R. A. Reed, L. W. Massengill, M. L. Alles, D. M. Fleetwood, X. J. Zhou, L. Tsetseris, and S. T. Pantelides, "Reliability and Radiation Effects in IC Technologies", IEEE, Year 2008, pp. 97-106.

* cited by examiner

*Primary Examiner* — Nghia Doan
(74) *Attorney, Agent, or Firm* — Lawrence J. Bassuk; W. James Brady; Frederick J. Telecky, Jr.

(57) ABSTRACT

According to an aspect of the present invention, statistical timing analysis is applied with respect to a stress degradation that occurs in fabricated integrated circuits (IC) when used for a long duration. The circuit design may be suitably modified to account for the degradations (e.g., those caused by NBTI and CHC for transistors, those caused due to electromigration in case of interconnects). As a result, the fabricated ICs may be less susceptible to such degradations. The features are extended to model complex circuit blocks and also account for different degrees of stress that different circuit blocks are subjected to, in a same age of operation.

2 Claims, 5 Drawing Sheets

FABRICATING IC WITH NBTI PATH DELAY WITHIN TIMING CONSTRAINTS

RELATED APPLICATION(S)

The present application claims the benefit of co-pending India provisional application serial number: 175/CHE/2008, entitled: "Framework for incorporating transistor degradation into chip-level timing analysis and asymmetric aging analysis", filed on 21 Jan. 2008, naming Texas Instruments Inc. (the intended assignee) as the Applicant, and naming the same inventors as in the present application as inventors, and is incorporated in its entirety herewith.

BACKGROUND

1. Field of the Invention

The embodiments of the disclosure relates generally to design of integrated circuits (IC), and more specifically to producing ICs which are less susceptible to degradations caused due to operational stress.

2. Related Art

Operational stress (or succinctly "stress") is caused by applying voltage/current to various circuit elements such as transistors, interconnects, capacitors, etc., within an IC as is well known in the relevant arts. The operational stress on a circuit element is generally a function of the strength of the voltage/current (applied to the element), operating temperature (in which the element operates) and duration of operation (usually of magnitude of months or years) of the circuit element, though other variables such as radiation and operational altitude type of attributes may also be considered depending on the environment of interest.

Operational stress degrades circuit elements. Degradation (stress degradation) refers to change in a fundamental characteristic/composition of the circuit element due to the application of stress. In case of transistors, degradation is caused due to a phenomenon commonly referred to as Negative Bias Temperature Instability (NBTI) in case of PMOS transistors, and due to as Channel Hot Carrier (CHC) in case of NMOS transistors. In case of metal interconnects, the degradation is caused due to electromigration or Joule heating phenomenon. However, other phenomenon causes stress in other elements due to the element type and/or material used for fabrication of the element, as would be apparent to a skilled practitioner.

Different elements of ICs may respond differently to the applied stress. For illustration, Vt (threshold voltage at which the transistor changes state from 1 to 0 or vice versa), an example parameter representing stress degradation in case of transistors, changes due to stress. The changes in Vt in turn changes (typically increases) the switching time (and thus the delay) of the transistor, thereby potentially causing the IC to deviate from the desired operation (typically by malfunctioning) over a period of time. Similarly, in case of metal interconnects, the stress due to electromigration or Joule heating changes the resistance thereby affecting the delay of the circuit. Based on the nature of the stress, the change in the delay could be a gradual degradation or a catastrophic failure.

It is accordingly desirable that ICs be designed to be less susceptible to such stress degradations.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

According to an aspect of the present invention, statistical timing analysis is applied with respect to a stress degradation that occurs in fabricated integrated circuits (IC) when used for a long duration. The circuit design may be suitably modified to account for the degradations (e.g., those caused by NBTI and CHC). As a result, the fabricated ICs may be less susceptible to such degradations.

In an embodiment implemented with respect to transistors, the values of parameters such as threshold voltage (Vt) of transistors which are affected, are identified in relation to different stress levels (including ageing), the delay caused by the transistor for each Vt are measured using static timing analysis (STA), and a sensitivity model for the transistor is formulated by fitting the determined delays and Vt into a function.

One more aspect of the present invention applies statistical timing analysis to complex circuit blocks. The corresponding model may take into account the NBTI caused degradations in case of PMOS transistors and CHC caused degradations in case of a NMOS transistors. In an embodiment, both the PMOS and NMOS transistors are contained in a pull-pull inverter configuration.

Yet another aspect of the present invention provides for accurate statistical timing analysis by factoring in different time durations that different circuit blocks would be subjected to stress, during operation. The duration of operation of the overall circuit is referred to as age and the specific amount of time for which an element is subject to stress (during the age) is referred to as 'time duration' of stress for that element. The time delay caused by each instance is computed as a factor of the value that would be indicated by the model, with the factor being proportionate (having positive correlation) to the specific time duration to which the instance would be subjected to stress, in a corresponding age.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE DRAWINGS

Example embodiments of the present invention will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

The features of the present invention are described below with respect to an example design flow.

1. Example IC Design Flow

Figure 1:
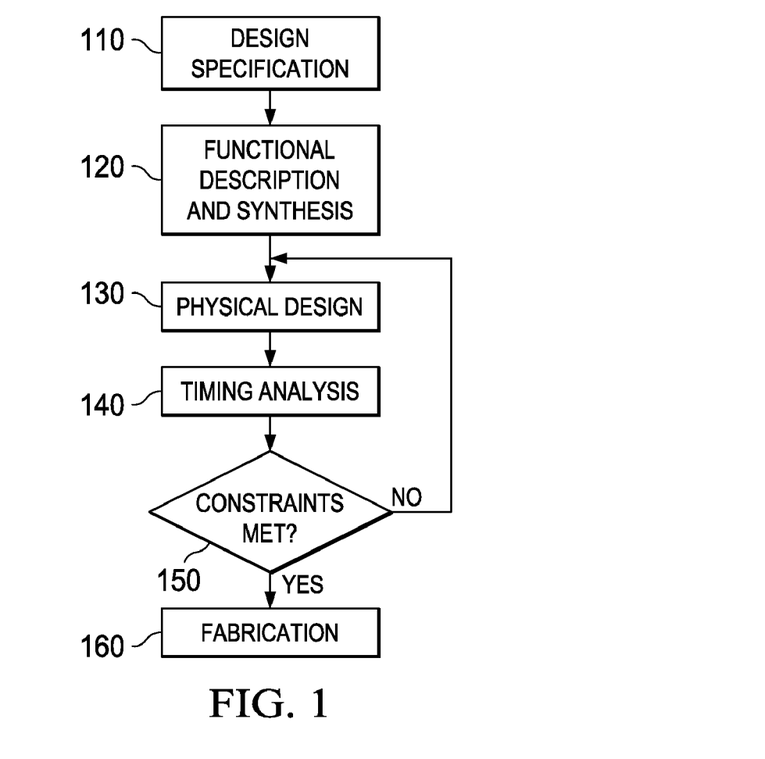
FIG. 1 is a block diagram illustrating an example flow cycle for designing an integrated circuit.

FIG. 1 is a diagram illustrating an example design flow cycle for an IC. The design flow is shown merely for the purpose of illustration, and may include other/alternative phases, and possibly other sequences of the phases as well. The design may start with design specifications (110) of the IC (circuit), in which the specifications of an IC may be generated. The circuit design indicates various circuit elements, including transistors, resistors, capacitances, inductances, interconnect paths, etc. A functional description and synthesis (130) phase may be performed next to create the circuit, a netlist (specifying interconnections between the various components in the circuit), as well as libraries of the components contained in the circuit.

Physical design (130) may be performed next, and generally involves placement of components in the circuit (represented by the corresponding netlist and libraries), and routing the interconnection(s) (signals, etc.) between the components. Physical design (130) may be performed ensuring that timing requirements (e.g., setup and hold times) of various signals in the IC are satisfied. Physical design (130) may generate as outputs, the physical layout of the components in the circuit, post-placement timing of various signals in the circuit, information regarding parasitic elements in the physical layout, etc. Physical design (130) may be performed in a manner consistent with several design requirements to be met (e.g., area of the placed and routed circuit, timing requirements, power consumption, etc).

Timing analysis 140 may be performed as a next phase, in which the arrival times of the signals at various paths/nodes in the circuit (IC) are estimated, typically based on delay models (gate delays, connection-path or wire delays, etc., based on the output of the physical design phase 130). The timings at the various nodes in the design may be checked against desired timing constraints (i.e., a comparison of arrival times against required times is made, whether set-up and hold times of clocked components/registers are satisfied, etc.).

If the design requirements (timing, area, etc., noted above) are satisfied (decision block 150), the output of the physical design process is sent for fabricating (160) the IC. If the design requirements are not met, then physical design (130) may be performed again. In some instances, functional description and synthesis (120) may be repeated with corresponding modifications, and the following phases may be repeated till the design requirements are met. Thus, the design flow process of above may be iterative.

As aspect of the present invention enables ICs thus fabricated less susceptible to degradations in transistors caused due to operational stress. The feature may be implemented in timing analysis 140 as described below in further detail.

2. Timing Analysis in General

As is well known, timing analysis may be viewed as containing two separate phases: (1) static timing analysis (STA); and (2) statistical timing analysis. In general, STA is based on providing specific values for each performance parameter associated each node/path of the IC, and accordingly STA indicates a specific delay value for the corresponding path/device of interest in the IC.

On the other hand, statistical timing analysis relies on providing a model (which is not a simple static number) for each of the performance parameters of the corresponding circuit element. By providing a model (which represents a set or range of numbers), variations in the characteristics can be analyzed using various statistical approaches and the results are also provided in terms of range of delay values for the path/node of interest. Statistical timing analysis can be used either as a substitute for, or in addition to, STA in a design flow, as is well known in the relevant arts.

Statistical static timing analysis (SSTA), well known in the relevant arts, is an example of statistical timing analysis. The statistical timing analysis can be used either as a substitute for, or in addition to, STA in a design flow, as is well known in the relevant arts.

Figure 2:
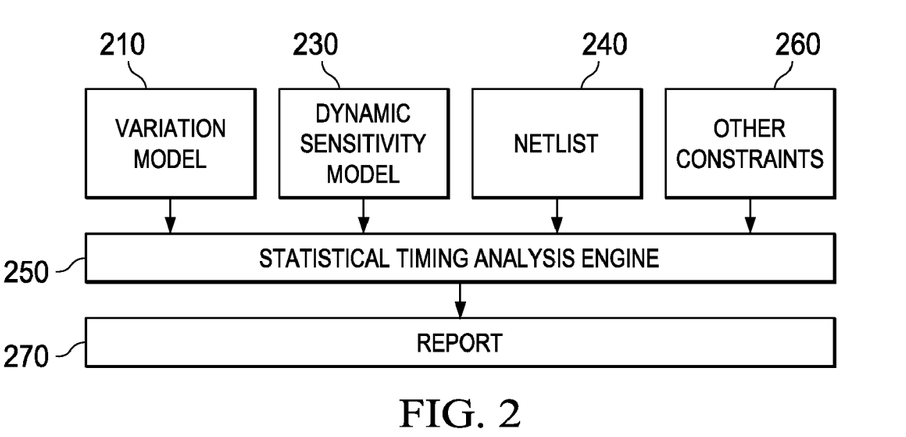
FIG. 2 is a block diagram illustrating statistical timing analysis in an embodiment.

FIG. 2 illustrates the general use of statistical timing analysis in a design flow in one embodiment. For general information on statistical timing analysis, the reader is referred to a document entitled, "Statistical Timing Analysis Based on a Timing Yield Model", by Farid N. Najm and Noel Menezes, published in DAC 2004, Jun. 7-11, 2004, San Diego, Calif., USA, and also another document entitled, "On the Need for Statistical Timing Analysis" by Farid N. Najm, published in DAC 2W5, Jun. 13-17, 2005, Anaheim, Calif., USA.

As shown in FIG. 2, variation model 210 defines the manner in which each parameter of interest for a specific type of path/node. The models can be specified in the form of equations (of a desired degree of polynomial), distributions, ranges, in general, any specification that expresses the expected behavior of the corresponding type of node/path. Dynamic sensitivity model 230 defines the manner in which the delay would vary with respect to changes in the parameters of 210.

Netlist 240 specifies the circuit design/transistor interconnects and the types of each path/node forming the IC sought to be tested. Other constraints 260 may specify the bounds/limits for performing the statistical timing analysis. Statistical timing analysis engine 250 performs the tests according to the inputs/specifications received from 210/230/240 and 260 and generates a report 270. As noted above, the report generally indicates the range of the delays for various paths in the circuit design.

According to an aspect of the present invention, the stress related degradations are provided as model for statistical timing analysis performance analysis, and therefore eventually provide ICs less susceptible to such stress related degradations. The features of the invention are described below in further detail with examples.

3. Design for Increased Reliability

Figure 3A:
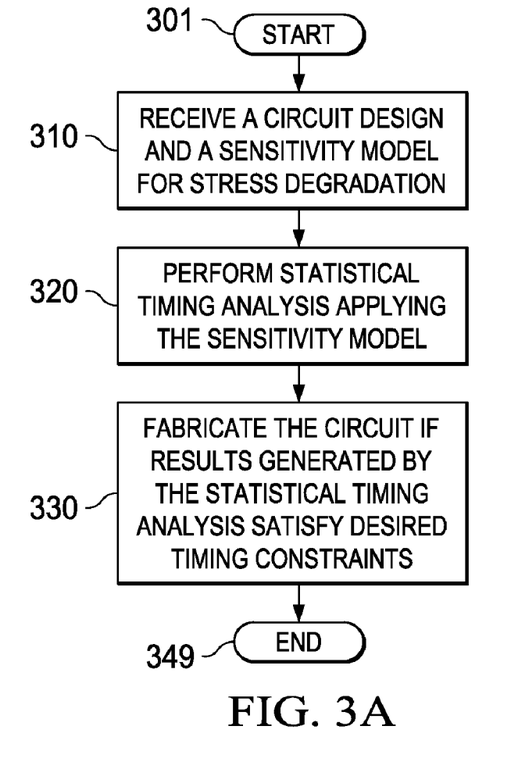
FIG. 3A is a flowchart illustrating the manner in which stress degradation is considered in providing fabricated ICs in an embodiment.

FIG. 3A is a flow chart illustrating the manner in which integrated circuits (ICs) are designed according to an aspect of the present invention. The flowchart is described with respect to FIGS. 1 and 2, and with respect to transistors merely for illustration. However, various features can be implemented in other environments and also applied to other element types (e.g., path characterized as a resistor and capacitance, each degrading with stress).

Furthermore, the steps are described in a specific sequence merely for illustration. Alternative embodiments in other environments, using other components, and different sequence of steps can also be implemented without departing from the scope and spirit of several aspects of the present invention, as will be apparent to one skilled in the relevant arts by reading the disclosure provided herein. The flowchart starts in step 301, in which control passes immediately to step 310.

In step 310, statistical timing analysis engine 250 receives a circuit design and a sensitivity model for stress degradation of a circuit block. A circuit block may contain one or more circuit elements. The circuit design may be received after steps 110, 120 and 130 of FIG. 1, described above. In general, the sensitivity model reflects the stress related degradations (e.g., NBTI and CHC, noted above) for each of the circuit elements forming the IC sought to be eventually fabricated. However, the model can address the degradations with respect to individual transistors or higher conceptual components (e.g., gates, buffers, etc.), typically based on the expected degradation of the individual transistors.

In step 320, statistical timing analysis engine 250 performs statistical timing analysis applying the sensitivity model for the transistors and other parts of the IC design, in addition to other inputs/parameters noted above with respect to FIG. 2. Applying the sensitivity models implies that the applicable delays indicated by the sensitivity model are considered in measuring the timing delays (and thus in checking whether the circuit design complies with timing constraints).

In general, the delay changes caused by stress degradations are identified more accurately due to the statistical approaches used by statistical timing analysis, and possibly included in report 270. It should be appreciated that the timing analysis can be performed for individual circuit blocks of various granularity (e.g., transistors, buffers, gates, IPs, etc.) or for various circuit paths/elements.

In step 330, the analyzed circuit design is sent for fabrication if the desired performance criteria are satisfied in the statistical timing analysis, as also described above with respect to step 150. It should be appreciated that the potential delays identified accurately, are used in deciding whether the expected performance is acceptable or not. A circuit design, which is less susceptible to the degradations, may accordingly be generated as described below with respect to FIG. 3B. The method ends in step 349.

4. Illustration of Enhanced Reliability

Figure 3B:
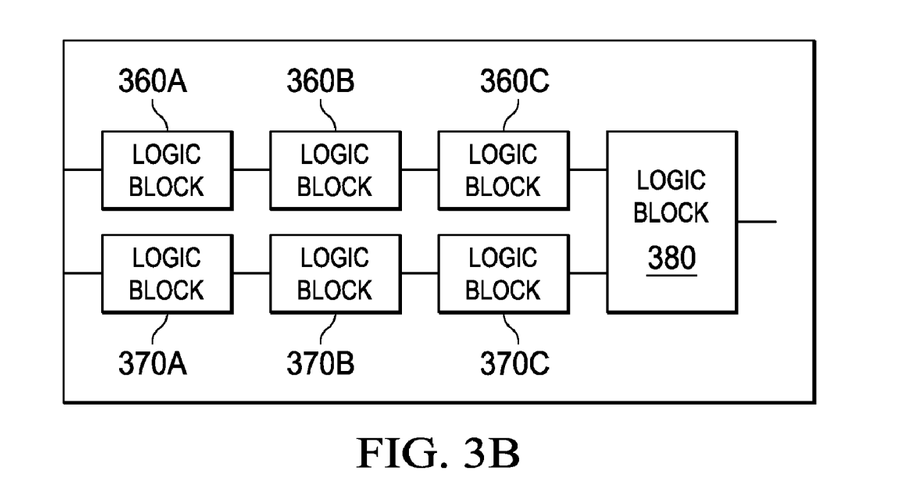
FIG. 3B is a block diagram illustrating a problem due to stress degradation in an embodiment.

FIG. 3B is a circuit diagram used to illustrate enhanced reliability obtained in an embodiment of the present invention. As shown there, logic blocks 360A-360C (along with corresponding interconnects) represents one path and logic blocks 370A-370C represents another path. Logic block 380 operates based on the two signals generated by the two paths.

It is assumed hypothetically that logic block 360B degrades substantially more over time, thereby causing a substantially longer delay on the first path (at such distant future time point). As a result, the signal on the first path may be received at a substantially later time instance, thereby causing logic block 380 to operate from an earlier result signal generated on the first path. The output thus generated would be erroneous and accordingly, the IC may become inoperable over time quickly (i.e., is susceptible to stress related degradation).

Several remedial measures may be taken once such a situation is identified based on the results generated in step 320 described above. For example, logic block 370B may be chosen to have similar degradation, thereby delaying the signals substantially equally on both the paths.

It may thus be appreciated that potential failures can be identified (and remedial measures taken) using statistical timing analysis approaches in a known way, once the sensitivity models are formed for the circuit blocks of interest. The manner in which the sensitivity models can be generated is described below with examples for illustration.

5. Forming Sensitivity Model

Figure 4A:
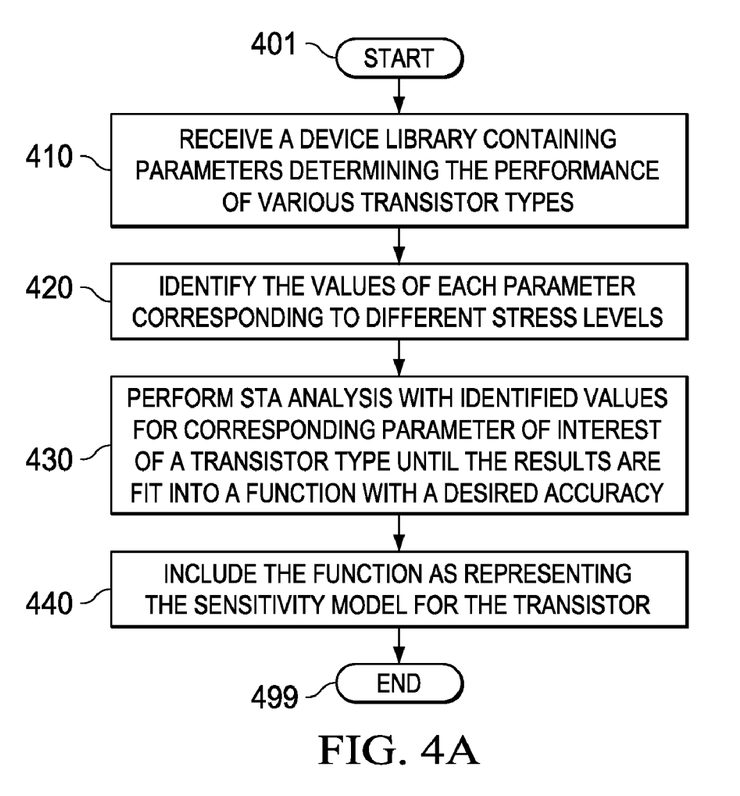
FIG. 4A is a flow chart illustrating the manner in which sensitivity model is formulated for a circuit element in an embodiment.

FIG. 4A is a flow chart illustrating the manner in which integrated circuits (ICs) are designed according to an aspect of the present invention. The flowchart is described with respect to FIGS. 2 and 3A merely for illustration. However, various features can be implemented in other environments.

Furthermore, the steps are described in a specific sequence merely for illustration. Alternative embodiments in other environments, using other components, and different sequence of steps can also be implemented without departing from the scope and spirit of several aspects of the present invention, as will be apparent to one skilled in the relevant arts by reading the disclosure provided herein. The flowchart starts in step 401, in which control passes immediately to step 410.

In step 410, a device library containing parameters determining the performance of various transistor types is received. A transistor type is characterized by physical attributes such as channel type (NMOS/PMOS, etc.), channel type/size, fabrication technology (90 nm, 45 nm, etc.), etc. The (performance) parameters include the threshold voltage (Vt), mobility of charge carriers, Miller Capacitance, Drain Induced Barrier Lowering (DIBL) Parameter etc. As described below, steps 420 and 430 operate to provide a sensitivity model for each transistor type for corresponding stress levels.

In step 420, the values of each parameter of interest corresponding to different stress levels are computed. The parameters of interest are selected based on knowledge of the extent to which each parameter for a corresponding circuit element is affected due to stress and how the changing values of a parameter in turn affect long term reliability of the transistor/circuit. In an embodiment, in case of transistors, the set of parameters of interest includes Vt.

In general, based on the device characteristics, the relationship of the parameter with respect to stress is well known, and the known relationship is used for computing the parameter values for different stress levels. For example, different values for Vt may be computed according to the below equation:

$$\Delta V_t = A * e^{\beta V_{dd}} * e^{\frac{E_a}{KT}} * t^n$$

wherein ΔVt represents a change/degradation of Vt

A, β, K (Boltzman Constant), N are constants which are either well known, or are determined in a known way based on fabrication technology sought to be used.

Vdd (or Vgs) is an applied voltage between drain and source (gate and source) of the transistor, T represents the operating temperature at which the transistor and t is the time duration (e.g., after 6 months of use or 5 years of use) the voltage/temperature are applied.

Thus, using the above equation, the change in Vt value for each stress condition (i.e., a specific combination of voltage, temperature and age) can be computed. Assuming further that the initial Vt at 0 stress or time of manufacturing is known, Vt at each age of interest is computed by subtracting delta Vt from Vt at age 0. Similar relationships can be defined for other parameters of interest and values computed for different stress conditions, as will be apparent to one skilled in the relevant arts.

In step 430, STA (static timing) analysis is performed multiple times with the identified values for corresponding parameters of interest of a transistor type until the results can be fit into a function with a desired accuracy. It may be appreciated that each STA analysis is performed for the identified values for the same stress (i.e., same value for voltage, time/age and temperature) to obtain the corresponding expected delay for the transistor.

As is well known, a function can be any of polynomial, distribution, etc. Further various well known curve fitting techniques can be used to fit the STA analysis results into a suitable function/polynomial.

For example, assuming a function is sought to be formed only based on Vt and perform only 2 STA analysis corresponding to two stress levels, the results (delay) can only be fit into a linear equation of the form (a*Vt+b), and the values for a and b can be solved by using the STA analysis results. Additional computations may be performed for higher degree polynomials, which may provide a more accurate sensitivity model.

Similarly, additional variables would be present in the polynomial when more parameters are considered. The polynomial can be constructed in a known way in such situations, by reading the disclosure provided herein.

In step 440 the formed function is provided as representing the sensitivity model for the transistor. In the example of above, (a*Vt+b), with the solved values for a and b, is included as the sensitivity model for the transistor. In general, when other parameters are considered, the sensitivity model is correspondingly more complex, as will be apparent to a skilled practitioner. The method ends in step 459.

Thus, once the sensitivity model is thus computed for each transistor, statistical timing analysis may be performed for the entire IC. In general, the sensitivity model needs to be a part of the complete model that defines the delay sensitivity in view of other factors (other than stress) such as process variations, etc. The formulation and use of such complete model for statistical timing analysis would be apparent to one skilled in the relevant arts.

Furthermore, while the description above is provided with respect to a single transistor (an instance of a simple circuit block), it should be appreciated that such sensitivity model is often desired for circuit blocks of higher granularity (i.e., containing multiple transistors). Some of the underlying principles in forming models for circuit blocks, are described below with examples.

6. Extension to Complex Circuit Blocks

Figure 4B:
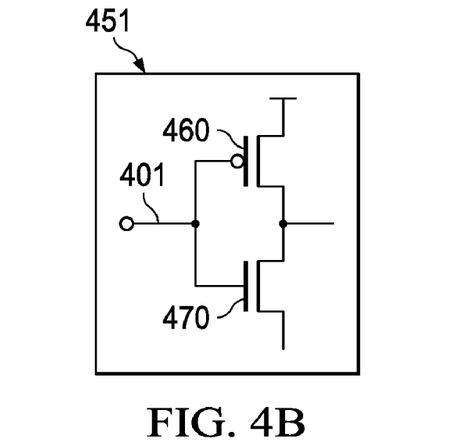
FIG. 4B is a circuit diagram of an inverter used to illustrate the modeling of a circuit block in an embodiment.

With respect to the push-pull inverter structure 451 of FIG. 4B, it may be appreciated that PMOS transistor 460 determines the response times of transitions. Further, only when the input is at logic low, transistor 460 is under stress (considering only NBTI degradation) since when the input is at logic high Vds equals 0 (or no current). However, transistor 470 would be stressed in case of input switching and current flowing through it, due to CHC degradation. For simplicity of explanation, we limit our description only to NBTI and the features are extendible to comprehend CHC and other stress effects.

Accordingly, the inverter may be viewed as a single circuit block, with the Vt of PMOS transistor 460 being used in the stress analysis.

It should be further appreciated that degradation in Vt of PMOS transistor 460 would be of more concern in delay sensitivity (when output transitions from 0 to 1) because PMOS transistor 460 is implemented with larger size (dominant transistor) to pull the output voltage while transitioning from 0 to 1.

Thus, the inverter is delay sensitive to only rising edges at the output and accordingly delay considerations are to be applied only for falling input transitions (when applying the steps of steps of FIG. 4A). Therefore, inverter 451 would need to be modeled for sensitivity, while transitioning of output from 0 to 1. In other words, the model may ignore the stress when the output is transitioned from 1 to 0.

Therefore, the stress degradations are considered only for the duration when input (401) is at 0. Accordingly, time duration in the modeling equation for a given age (the amount of time the IC has been used after fabrication) of above may factor in the expected proportion of time for which the input is expected to be at 0. When a transistor is stressed during all duration of operation of an IC, the time duration would equal the age.

Further, when performing timing analysis, the additional delay due to stress degradations are considered only for the input transitions 1 to 0.

While the description of above is provided with respect to a simple inverter circuit for illustration, it should be appreciated that more complex circuit blocks can also be modeled for delay sensitivity based on the disclosure provided herein.

In general, when different circuit blocks are subjected to different durations of stress for a same age of operation of an IC, by considering only such expected stress duration, the analysis may be correspondingly more accurate. However, factors such as reduction of complexity of analysis, etc., may also be considered in ignoring such changes. In general, the different durations of stress caused on different circuit blocks, is termed as asymmetric degradation.

Further, it should be appreciated that a modeled circuit block may be stored in a library and multiple instances of the circuit block may be employed in an IC. In such a situation, different instances may be exposed to different stress and the timing analysis may accordingly need to consider such differences, for further enhancing the reliability of the statistical timing analysis.

7. Asymmetric Stress of Different Instances

Figure 5:
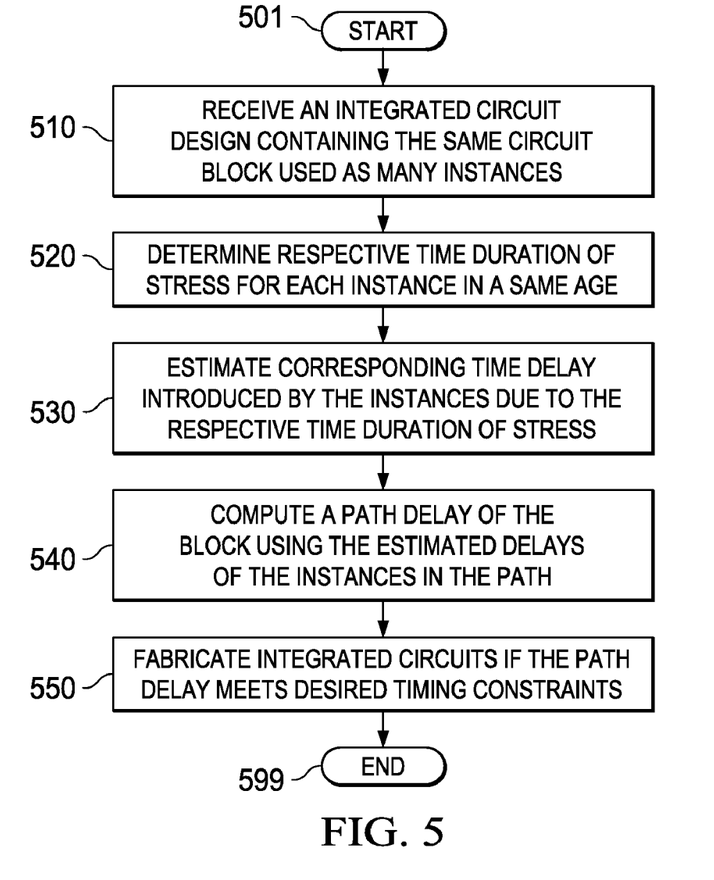
FIG. 5 is a flowchart illustrating the manner in which timing analysis is performed for a path in case of asymmetrical degradation.

FIG. 5 is a flowchart illustrating the manner in which the delays (over age) of paths employing same circuit block can be estimated accurately according to an aspect of the present invention. The flowchart is described with respect to FIGS. 2 and 3 for illustration, though the features can be implemented in various other environments.

Furthermore, the steps of FIG. 5 are described in a specific sequence merely for illustration. Alternative embodiments in other environments, using other components, and different sequence of steps can also be implemented without departing from the scope and spirit of several aspects of the present invention, as will be apparent to one skilled in the relevant arts by reading the disclosure provided herein. The flowchart starts in step 501, in which control passes immediately to step 510.

In step 510, statistical timing analysis engine 250 receives an integrated circuit design containing the same circuit block used as many instances. Each circuit block may contain one or more transistors (and corresponding interconnects), as noted above. At the time of completion of fabrication, it may be expected that all the instances will have similar fundamental characteristics/material, and the sensitivity model for all the instances is represented by the same function.

In step 520, statistical timing analysis engine 250 determines respective time duration of stress for each instance in a same age. In general, the circuit design, including the functions/interconnections of the circuit block, may be analyzed (for example, as illustrated with respect to FIG. 4B above) to determine the respective time duration. Alternatively, a user may provide approximate values to statistical timing analysis engine 250, based on experience and/or previous simulation models.

In step 530, statistical timing analysis engine 250 estimates corresponding time delay introduced by the instances due to the respective time duration of stress. While the time delay may have a positive correlation with the duration of stress, more accurate estimates may be formed by considering the extent of stress degradation as a function of time/stress, and how specific levels of degradation impact the delay characteristics of the transistors contained within each instance.

In step 540, statistical timing analysis engine 250 computes a path delay of the circuit block using the estimated delays of the instances in the path. The path delay is the sum of the estimated delays of the instances in the path.

In step 550, integrated circuits are fabricated if the path delay meets desired timing constraints. Any required corrective measures may be taken otherwise, as described above with respect to FIG. 1. The method ends in step 599.

Thus, by factoring in different levels of degradations caused due to asymmetric stress, delays over age may be more accurately determined.

It may be appreciated that since stress is function of the applied voltage, operational temperature and the ON-time of the transistor, different transistors of a circuit can potentially degrade to different amounts, warranting the need of such a detailed asymmetric aging analysis.

It should also be noted that from an IC's Power Management perspective, the clocks can be forcefully be made to remain idle for longer period of times. With the example below, we illustrate how the gating input to the clock can significantly affect its fundamental properties, further necessitating the need for such an analysis.

Furthermore, different power management schemes, including voltage islands, power gating, dynamic-voltage-frequency-scaling and adaptive-voltage-scaling also leads to building of asymmetric stress within different circuit blocks. Embodiments of the present disclosure address above problems by identifying the accurate stress for each circuit blocks in the timing analysis.

Figure 6A:
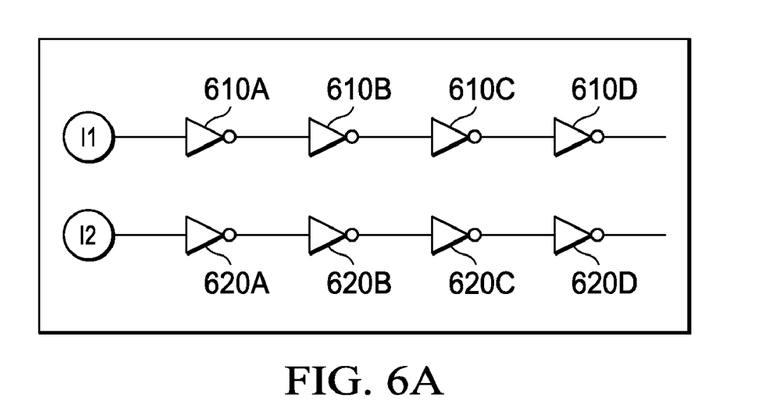
FIG. 6A is a circuit diagram illustrating the use of instances of a same circuit block in an embodiment.

The features of FIG. 5 are illustrated below with an example. FIG. 6A is a circuit diagram showing two paths (or clocks), each containing instances of the same circuit block, but being driven by inputs I1 and I2 respectively. In the clock terminology, it can be readily inferred as gated clocks. The combination of two successive instance is thus assumed to have the configuration shown in FIG. 6B. It is now shown that the delays can be different through the two paths in a scenario where I1 is maintained at logic 1 for a long age (e.g., 1 year) and switched to 0, while I2 is maintained at 0 for the same age and switched to 1.

Figure 6B:
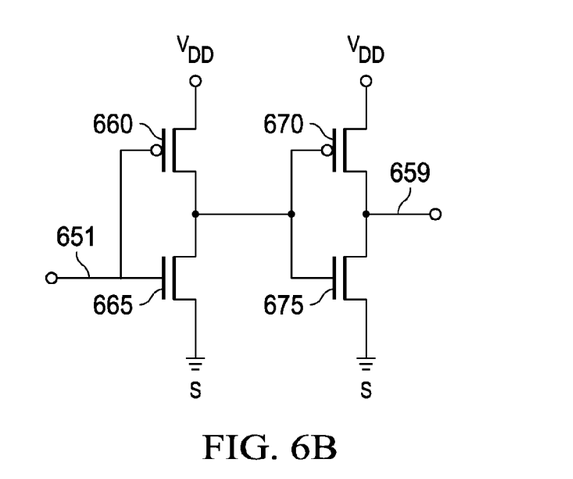
FIG. 6B is a circuit diagram of a pair of inverters in sequence in an embodiment.

In case of the first path, it may be readily observed that only PMOS transistor 660 of FIG. 6B is substantially stressed when the input 651 is at 1. Since the logic level is maintained for a long time, the degradation of transistor 660 is more than other transistors (including 670).

In case of the second path, when input 651 is at 0, PMOS transistor 670 is stressed substantially.

It is assumed there is a rise delay (for output to be rising at 610D) d1 when I1 switches from 0 to 1, and similarly a delay d2 (for output to be rising at 620D) when I2 switches to 1. It can be further assumed that d1 and d2 are designed to be equal at time zero. Assuming we now stress the path 1 (comprising of inverter 610A to 610D) keeping the input I1 to logic 0, and the path 2, while keeping the input I2 to logic 1. It is now shown that subsequent to this stress (which is the clock gating duration) d2 is greater than d1. The delays d1 and d2, through the paths 1 and 2 can be mathematically written down as:

$$d1 = \text{fall delays of inverter } 610A, 610C + \text{rise delays of inverter } 610B, 610D \quad (1)$$

$$d2 = \text{fall delays of inverter } 620A, 620C + \text{rise delays of inverter } 620B, 620D \quad (2)$$

As the input stress applied to the path 1, I1, is logic 0, it can be understood that this input stress will only stress the PMOS transistors of inverters 610A and 610C, as the inverters 610B and 610D see the input as logic 1. Alternatively, the input stress I2 will only stress the PMOS transistors of inverter 620B and 620D.

With above stress assumption and equations 1 and 2, it can be concluded that such an asymmetric stress on two perfectly identical circuit blocks will lead to the two delays being different.

Consequently, if the two paths were gated clocks, it may be readily observed that the gating input for the clock can significantly affect the delay through the clock when the clock is made active again. Thus an embodiment may rightly identify the gating inputs of the clocks and appropriately assign degradation to the corresponding clock circuitry.

Several complex scenarios, such as down-tree gating within a gated clock and the active edge flipping within the clock can be handled.

It may be readily observed that if the inputs I1 and I2 were switching at different rates with respect to one another, it could lead to asymmetric stress development in the two paths because of CHC effects.

Further, the asymmetric metal resistance degradation due to one or several power management scenarios (power gating, shut-down, voltage islands, differential frequency application) can also be comprehended through the invention by extending the model to consider interconnect degradation.

Several features of the present invention may be implemented using a desired combination of software, hardware, or firmware. In general, when throughput performance is of primary consideration, the implementation is performed more in hardware (e.g., in the form of an application specific integrated circuit). When cost is of primary consideration, the implementation is performed more in software (e.g., using a processor executing instructions provided in software/firmware). Cost and performance can be balanced by employing a mix of hardware, software and/or firmware.

The description is continued with respect to an embodiment in which various features described above are operative upon execution of appropriate software instructions.

8. Digital Processing System

Figure 7:
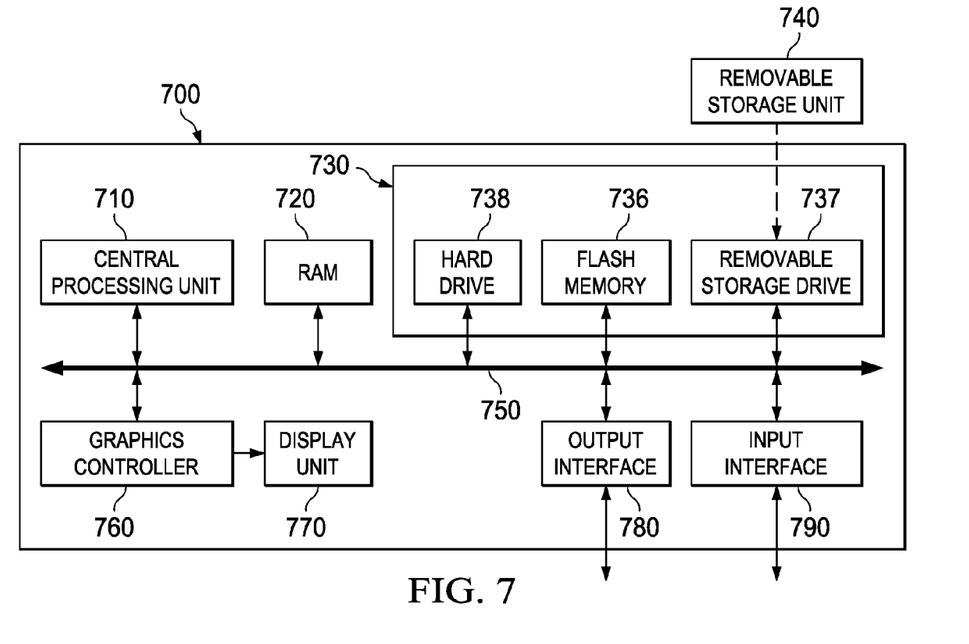
FIG. 7 is a block diagram containing the details of a system in which several features of the invention are operative upon execution of appropriate software instructions.

FIG. 7 is a block diagram illustrating the details of digital processing system 700 in which several aspects of the present invention are operative by execution of appropriate software instructions. Digital processing system 700 may contain one or more processors such as a central processing unit (CPU) 710, random access memory (RAM) 720, secondary memory 730, graphics controller 760, display unit 770, output interface 780 and input interface 790. All the components may communicate with each other over communication path 750, which may contain several buses as is well known in the relevant arts.

CPU 710 may execute instructions stored in RAM 720 to provide several features of the present invention (described in sections above). CPU 710 may contain multiple processing units, with each processing unit potentially being designed for a specific task. Alternatively, CPU 710 may contain only a single general-purpose processing unit. RAM 720 may receive instructions from secondary memory 730 using communication path 750.

Input interface 790 may correspond to a keyboard and a pointing device (e.g., touch-pad, mouse) and may be used to provide various inputs, including design specification of an IC, EM reliability measure, current density limits for metal paths, etc. Output interface 780 provides connectivity to devices external to system 700, and may be used to communicate with other connected systems (not shown). Output interface may be used to output a placed-and-routed design of an IC.

Secondary memory 730 may contain hard drive 738, flash memory 736, and removable storage drive 737. Secondary memory 730 may store the data (e.g., libraries, sensitivity models, etc., shown in FIG. 2) and software instructions, which enable digital processing system 700 to provide several features in accordance with the present invention.

Some or all of the data and instructions may be provided on removable storage unit 740, and the data and instructions may be read and provided by removable storage drive 737 to CPU 710. Floppy drive, magnetic tape drive, CD-ROM drive, DVD Drive, Flash memory, removable memory chip (PCMCIA Card, EPROM) are examples of such removable storage drive 737.

Removable storage unit 740 may be implemented using medium and storage format compatible with removable storage drive 737 such that removable storage drive 737 can read the data and instructions. Thus, removable storage unit 740 includes a computer readable (storage) medium having stored therein computer software and/or data. However, the computer (or machine, in general) readable medium can be in other forms (e.g., non-removable, or removable, etc.).

In this document, the term "computer program product" is used to generally refer to removable storage unit 740 or hard disk installed in hard drive 738. These computer program products are means for providing software to digital processing system 700. CPU 710 may retrieve the software instructions, and execute the instructions to provide various features of the present invention described above.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A process of designing integrated circuits comprising:
   A. receiving an integrated circuit design containing a first circuit block and a second circuit block, the circuit blocks containing the same transistors and corresponding interconnects, having similar fundamental characteristics/material, and having a sensitivity model represented by the same function;
   B. determining a time duration of stress for each circuit block in a same age, the determining including analyzing the functions/interconnections of each circuit block to determine the respective time durations of stress of each block;
   C. estimating a corresponding time delay introduced in each circuit block due to respective time durations of stress;
   D. computing, by a computer, a circuit path delay for a first path, which includes each of the first and second circuit blocks, using the estimated delay of each block in the first path, including summing the estimated delays of the circuit blocks in the first path; and
   E. fabricating an integrated circuit if the path delay of the first path meets desired timing constraints.

2. The process of claim 1 including computing a circuit path delay for a second path that includes third and fourth circuit blocks that are the same as the first and second circuit blocks, and fabricating the integrated circuit if the circuit path delay of the second path meets desired timing constraints.

* * * * *